US006409538B1

(12) United States Patent
Yatskov et al.

(10) Patent No.: US 6,409,538 B1
(45) Date of Patent: Jun. 25, 2002

(54) ELECTRICAL CONNECTOR ASSEMBLY FOR USE WITH VARIABLE THICKNESS CIRCUIT BOARDS

(75) Inventors: Alexander I. Yatskov, Kenmore; Stephen V. R. Hellriegel, Bainbridge Island, both of WA (US)

(73) Assignee: Cray Inc., Seattle, WA (US)

( * ) Notice: Subject to any disclaimer, the term of this patent is extended or adjusted under 35 U.S.C. 154(b) by 0 days.

(21) Appl. No.: 09/724,790

(22) Filed: Nov. 28, 2000

Related U.S. Application Data

(63) Continuation-in-part of application No. 09/705,386, filed on Nov. 3, 2000.

(51) Int. Cl.$^{7}$ ........................ H01R 13/60; H01R 13/66; H01R 12/00; H05K 1/00

(52) U.S. Cl. .......................................... 439/567; 439/78

(58) Field of Search ................................ 439/567, 908, 439/571, 572, 573, 78, 547, 554

(56) References Cited

U.S. PATENT DOCUMENTS

| | | | | | |
|---|---|---|---|---|---|
| 4,173,387 | A | * | 11/1979 | Zell | 439/557 |
| 4,934,943 | A | * | 6/1990 | Klein et al. | 29/834 |
| 5,125,849 | A | * | 6/1992 | Briggs et al. | 439/378 |
| 5,254,016 | A | * | 10/1993 | Ganthier | 439/567 |
| 5,281,166 | A | * | 1/1994 | Yu et al. | 439/571 |
| 5,382,168 | A | * | 1/1995 | Azuma et al. | 439/65 |
| 5,482,474 | A | * | 1/1996 | Yohn et al. | 439/289 |
| 5,522,730 | A | * | 6/1996 | Soes et al. | 439/78 |
| 5,634,810 | A | * | 6/1997 | Niitsu et al. | 439/378 |
| 5,671,125 | A | * | 9/1997 | Russell et al. | 174/260 |
| 5,807,136 | A | * | 9/1998 | Mick | 439/571 |
| 5,993,252 | A | * | 11/1999 | Laurx | 439/573 |
| 6,056,596 | A | * | 5/2000 | Etiembre | 439/572 |

* cited by examiner

*Primary Examiner*—P. Austin Bradley
*Assistant Examiner*—Edwin A. León
(74) *Attorney, Agent, or Firm*—SEED IP Law Group PLLC

(57) ABSTRACT

A casing assembly is provided for clamping to circuit boards of various thicknesses.

24 Claims, 9 Drawing Sheets

ELECTRICAL CONNECTOR ASSEMBLY FOR USE WITH VARIABLE THICKNESS CIRCUIT BOARDS

CROSS-REFERENCE TO RELATED APPLICATION

This application is a Continuation-in-part of U.S. patent application Ser. No. 09/705,386, filed Nov. 3, 2000, now pending, which application is incorporated herein by reference in its entirety.

This application is related to U.S. patent application Ser. No. 09/705,387, filed Nov. 3, 2000 and U.S. patent application Ser. No. 09/724966, filed the same day herewith, where these two co-pending patent applications are all incorporated herein by reference in their entireties.

TECHNICAL FIELD

This invention relates to an electrical connector assembly for mounting on printed circuit boards having different thicknesses from each other.

BACKGROUND OF THE INVENTION

In computers having a high density of integrated circuits, it is frequently desirable to mount electrical connectors to both sides of a single printed circuit board. In order to increase the densities further, it is beneficial if the same relative location on each side of the printed circuit board can be used for the mounting and retaining of electrical components, including connector assemblies and items which extend through the circuit board. Being able to use the maximum surface area on both sides of the circuit board provides significant improvements in the density and overall utilization of space on the printed circuit board.

Unfortunately, some types of connectors are cut through apertures that extend completely through the printed circuit board. For such electrical circuits, and connectors it may be very difficult to position another component, integrated circuit, or connector on the other side of the circuit board at the same relative location. Thus, the density with which components can be mounted on a printed circuit board is limited.

SUMMARY OF THE INVENTION

According to principles of the present invention, an electrical connector is provided which is coupled to a printed circuit board using an aperture which extends completely through the printed circuit board. The connector assembly is designed so that other components may also be mounted in the same aperture and be securely retained in the proper position. In one embodiment, the other component which may be mounted in an aperture is an identical connector assembly. Alternatively, other components, such as integrated chips, other types of connectors, or other components may also be designed to be aligned and connected to the same aperture as the connector assembly and being mounted on the other side of the printed circuit board.

A further advantage according to one embodiment of the present invention is that the electrical connector assembly is designed to be mounted to printed circuit boards having different thicknesses with respect to each other and still be properly aligned and firmly positioned.

DETAILED DESCRIPTION OF THE INVENTION

Figure 1:
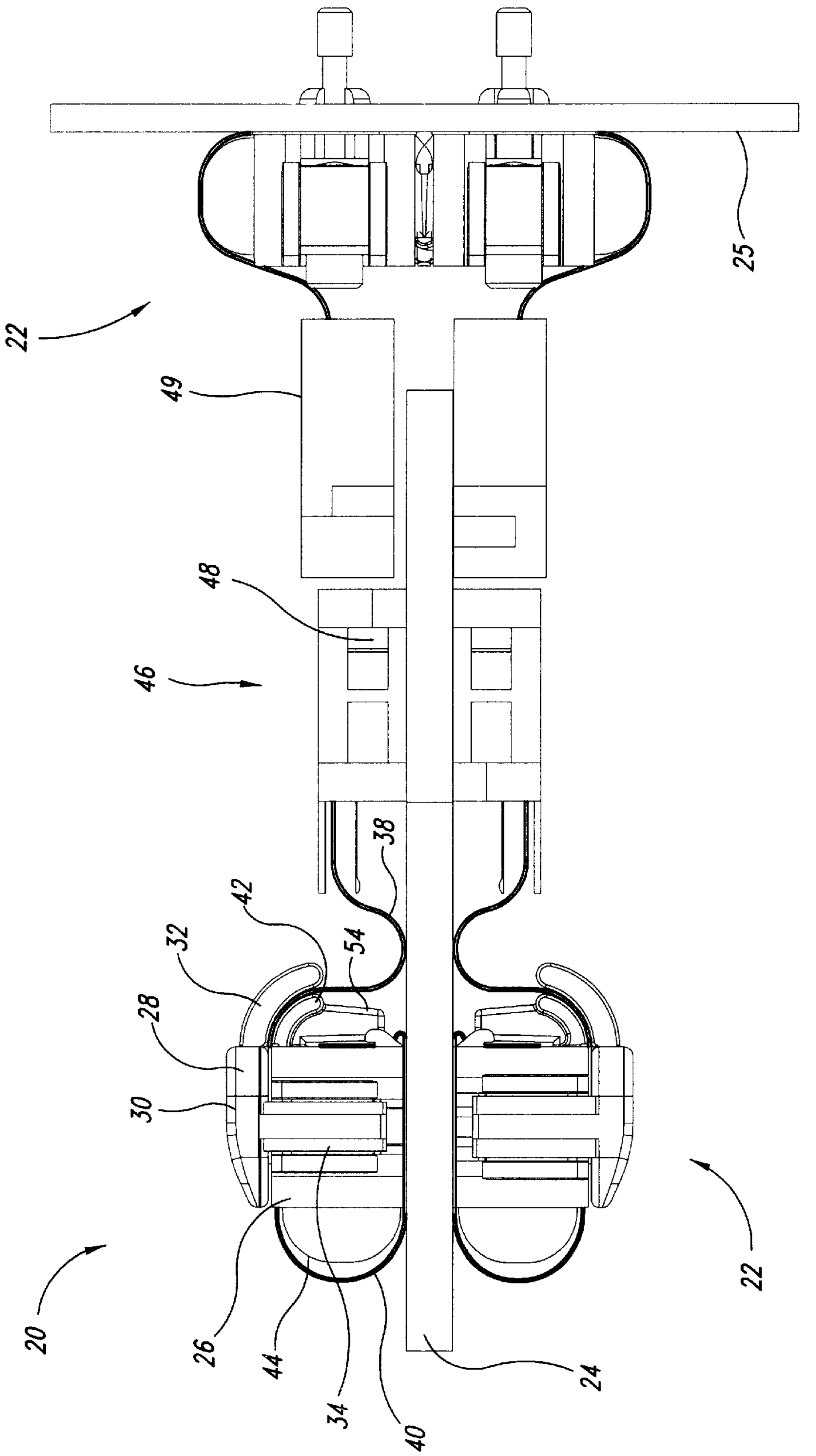
FIG. 1 is a side elevation view of one embodiment of the present invention.

FIG. 1 shows a first connector assembly 20 and a second connector assembly 22 coupled to a printed circuit board 24. The connector assemblies 20 and 22 are the same as the each other in the main respects. Accordingly, only a single electrical connector assembly 22 will be described and it will be understood, for those features so described, that the other connector assembly 20 contains the same features.

The connector assemblies 20 and 22 includes a lid 28 and a casing 26. The lid 28 includes a top 30, a cowling 32, and a connector arm 34. The connector arm 34 couples the lid 28 to the casing 26 by any acceptable technique, such as a clip on a flange or the like. The casing 26 includes support ridges 44 on a back side thereof and retaining flanges 54 on a front side thereof. A support clip 42 also extends from the front side, and mates with the cowling 32 of the lid to provide a space therebetween for a flexible electrical connector 38.

The purpose of the particular connector assembly 22 is to provide an electrical connection from the electrodes on the printed circuit board 24 to corresponding electrodes and traces on a top plane printed circuit board 25. Since there are a large number of traces, and a corresponding number of individual leads on the printed circuit board 24, it is desirable to provide a high density connection assembly for coupling the electrodes and traces on the printed circuit board 24 to the appropriate electrodes and traces on the top plane printed circuit board 25. Accordingly, an electrical connector strip 40 is held in a press fit under the casing 26 and extends along the outer perimeter of the support ridges 44 and is coupled to a miniature printed circuit board under the lid 28.

The printed circuit board under the lid 28 is not shown since the details of the connections are not relevant to the present invention. The electrical connector 40 is coupled to the flex strip electrical connectors 38 under the lid 28 and then the connectors 38 extend out of the front of the connector assembly 22 and into a shuttle housing 46. The shuttle housing 46 contains a plurality of electrical connectors on individual shuttles 48. The shuttles 48 may be advanced into receiving assembly 49 to mate with corresponding electrical connectors, usually pins, within the receiving assembly 49. The details of the electrical connection between the shuttle 48 and the shuttle housing 46 and the receiving assembly 48 is not particularly relevant to the present invention and therefore will not be described in detail.

Figure 2:
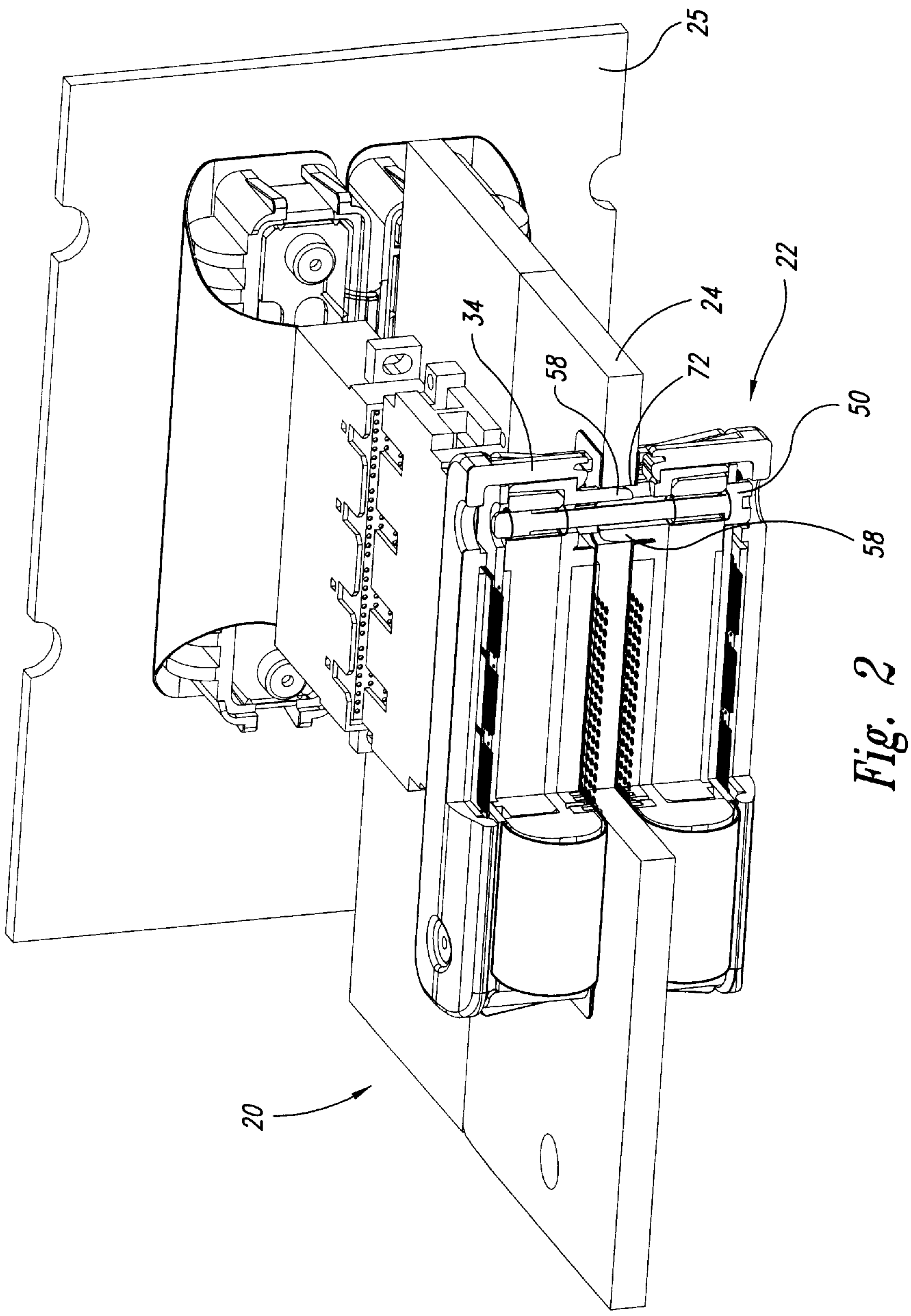
FIG. 2 is a partial cutaway of an isometric view of two connector assemblies coupled to a printed circuit board according to principles of the present invention.

As shown in FIG. 2, one or more threaded fasteners or bolts 50 extend completely through the connector assembly 22, through printed circuit board 24 and into connector assembly 20. Thus, fasteners 50 hold both connector assemblies rigidly connected to the printed circuit board 24. The connector assemblies include alignment posts 58 to properly align the connector assemblies with the printed circuit board 24 and with each as will now be explained.

Figure 3:
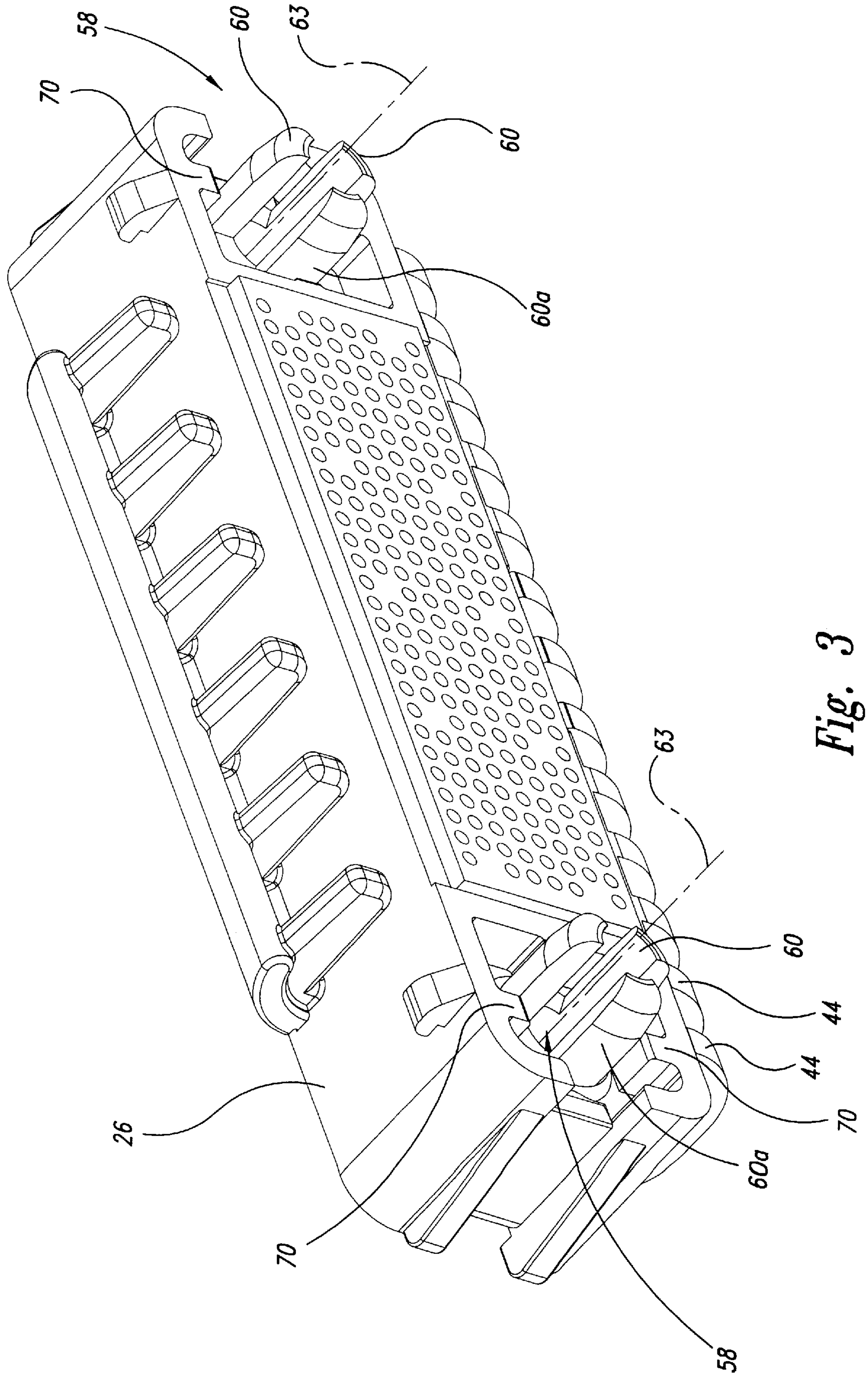
FIG. 3 is a bottom, isometric view of a casing having a pressure pad thereon.
Figure 4:
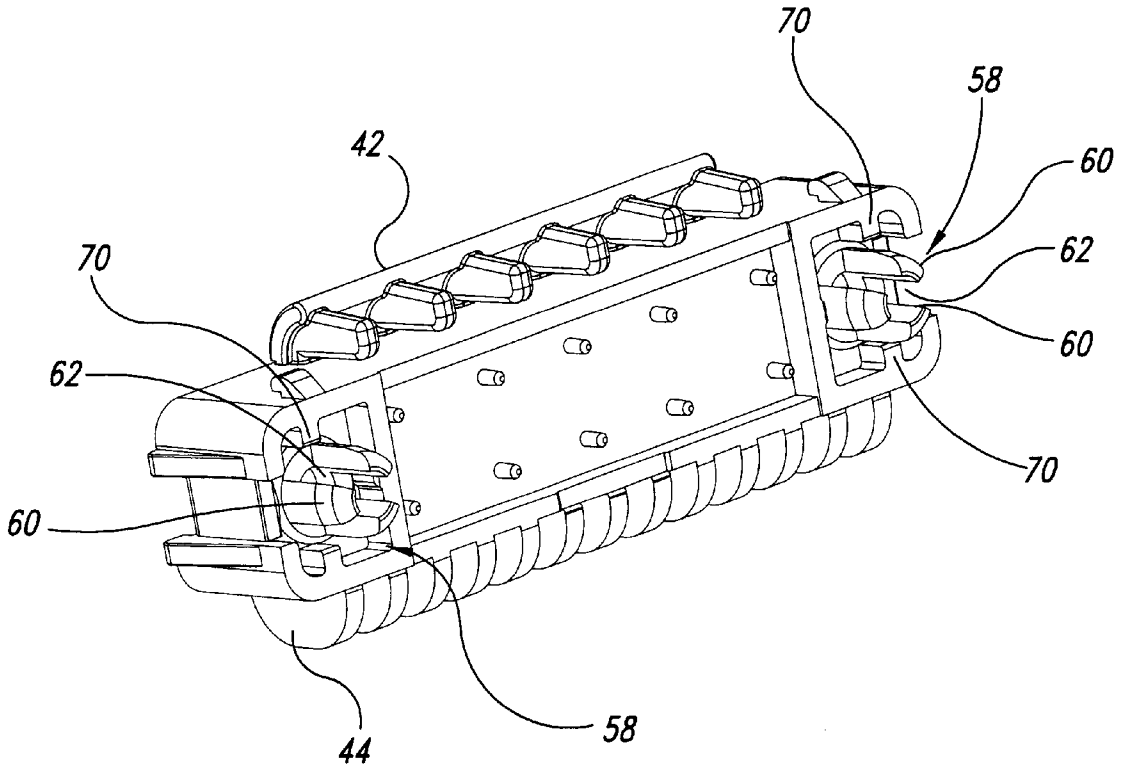
FIG. 4 is a bottom, isometric view of a casing constructed according to principles of the present invention.

FIGS. 3 and 4 show two different views of the connector casing 26, including the alignment posts 58 on the bottom of the casing 26. Each of the alignment posts 58 are formed of a plurality of alignment prongs 60 projecting from the bottom of the casing 26. Each alignment post 58 is substantially identical to the other so that the description of one post 58 applies as well to the other post 58. Preferably, each post 58 is formed of three or more alignment prongs 60 with an equal number of alignment slots 62 formed between each two prongs 60. The use of three prongs 60 in an alignment post 58 permits the prongs to be properly and precisely aligned each time. The alignment prongs 60 extend in a circular fashion from the casing 26 at substantially identical radial distances from the center line or longitudinal axis 63 of the alignment post 58. The alignment prongs 60 all have substantially the same angular width or cross-section as measured from the longitudinal axis 63. Furthermore, the alignment prongs 60 all have a substantially constant and identical cross-section along substantially their entire length, except for a small lead-in chamfer on the tip of prong 60 distal from the casing 26 and a small stress relief fillet at the base of each prong 60 adjacent to the casing 26. The constant and identical cross-section is defined by a plane perpendicular to the longitudinal axis 63.

The slots 62 are sized and positioned to closely match the prongs 60 which extend from a mating casing 26 that is positioned on the other side of a printed circuit board 24. The slots 62 are preferably formed with substantially the same angular width or cross-section as the alignment prongs 60 as measured from the longitudinal axis 63, except each slot 62 is optionally formed with sufficiently greater angular width than a corresponding prong 60 to allow the mating prong 60 to enter the intended slot 62. For example, the slots 62 are formed with a conventional slip fit or interference fit with a corresponding prong 60. Preferably, as mentioned above, each slot is also formed with a stress relief round or fillet where the prongs intersect with the casing 26 to insure the integrity and operational life of the prongs 60. According to the preferred triangular prong configuration shown in FIGS. 3 and 4, all three alignment prongs 60 are positioned at regular angular intervals around the circle formed by alignment post 58. Inherently therefore, all three slots 62 have the substantially same angular separation. Furthermore, because the angular slots 62 are defined by the side surfaces of the alignment prongs 60, the slots 62 are inherently positioned at substantially the identical radial distances from the longitudinal axis 63 of the alignment post 58 as the alignment prongs 60.

The preferred triangular configuration of alignment prongs 60 and interstitial slots 62 shown in FIGS. 3 and 4 is further repeated with substantially the same rotational orientation of the prongs 60 relative to the casing 26. For example, as shown in the Figures, one prong 60*a* of each post 58 is rotationally aligned with the length of the casing 26 with both prongs 60*a* facing in the same direction, i.e., a first prong 60*a* on the right-hand side is facing inwardly toward the casing 26, while a second prong 60*a* on the left-hand side is facing outwardly away from the casing 26. The substantial identity between the two posts 58 on each casing 26, including substantially identical rotational orientation, causes two casings 26 mounted on opposing sides of the circuit board 24 to appear as mirror images to one another. The mirror image effect allows the prongs 60 on one casing 26 to interleave with the prongs 60 on the other casing 26 by fitting into the slots 60 formed therebetween. Therefore, the slots 62 in one casing 26 accept the prongs 60 which extend from a mating casing 26 that is positioned on the other side of a printed circuit board 24 and align the two mating casings 26 relative to one another. Alternative configurations of prongs 60 and slots 62 within alignment posts 58 are also contemplated by the invention and by the claims thereto.

Figure 5:
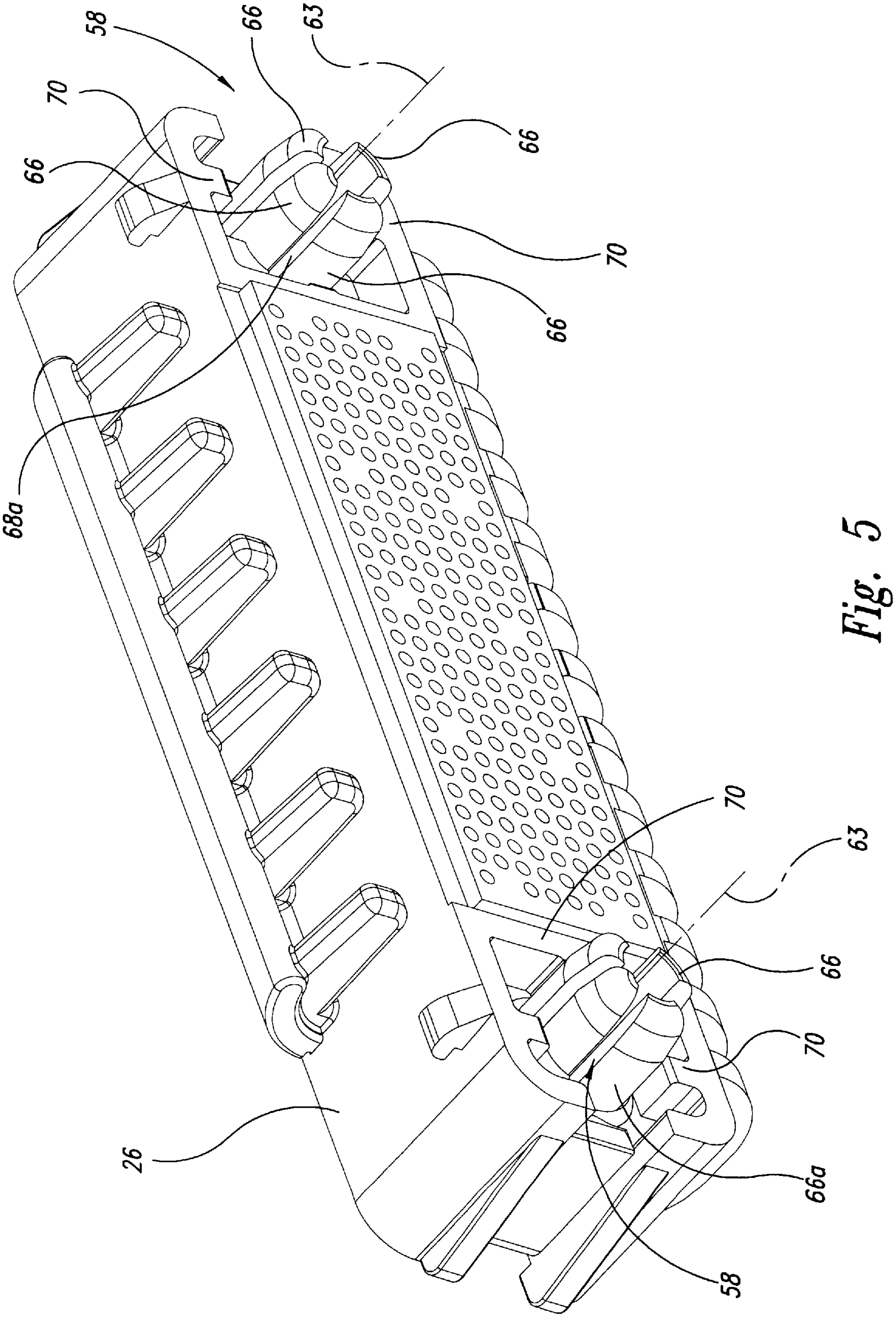
FIG. 5 is a bottom, isometric view of a casing having an alignment post formed in a quad configuration according to principles of the present invention.

FIG. 5 for example shows a quad configuration wherein the use of four prongs 66 in an alignment post 58 also permits the prongs to be properly and exactly aligned each time. The alignment prongs 66 extend in a circular fashion from the casing 26 at substantially identical radial distances from the center line or longitudinal axis 63 of the alignment post 58. The alignment prongs 66 all have substantially the same angular width or cross-section as measured from the longitudinal axis 63, except again for a small lead-in chamfer on the tip of each prong 66 distal from the casing 26. Furthermore, the slots 68 defined between adjacent prongs 66 are sized and positioned to closely match the prongs 66 which extend from a mating casing 26 that is positioned on the other side of a printed circuit board 24. The slots 68 are preferably formed with substantially the same angular width or cross-section as the alignment prongs 66 as measured from the longitudinal axis 63, except each slot 68 is formed with sufficiently greater angular width than a corresponding prong 60 to allow the mating prong 66 to enter the intended slot 68. According to the quad prong configuration, all four alignment prongs 66 are positioned at regular angular intervals around the circle formed by alignment post 58. Inherently therefore, all four intervening slots 68 have the substantially same angular separation and are inherently positioned at substantially the identical radial distances from the longitudinal axis 63 of the alignment post 58 as the alignment prongs 66.

Thus far, the description of the quad configuration is substantially the same as that of the above triangular configuration, and the two quad configuration alignment posts 58 are substantially identical. However, identity of rotational orientation relative to the casing does not provide a mirror image between two casings mounted on opposing sides of a circuit board 24. Rather, according to the quad configuration, one of the two quad alignment posts 58 has alignment prongs 66 rotated one quarter turn or 45 degrees relative to the alignment prongs 66 of the other alignment post 58. In other words, the left-hand alignment post 68 has a first prong 66*a* rotationally aligned with the length of the casing 26, while the other or right-hand alignment post 68 has a first prong 66*a* rotated a quarter turn from rotational alignment with the length of the casing 26 and a slot 68*a* rotationally aligned with the length of the casing 26. The relative rotation of the prongs 66 of one quad post 58 to the prongs of another quad post 58 creates the mirror image effect between the two opposing casings 26 that allows the prongs 66 on one casing 26 to interleave with the prongs 66 on the other casing 26 by fitting into the slots 68 formed therebetween. Therefore, the slots 68 in one casing 26 accept the prongs 66 which extend from a mating casing 26 that is positioned on the other side of a printed circuit board 24 and align the two mating casings 26 relative to one another. Other alternative configurations of prongs 60 and slots 62 are considered equivalent and within the scope of the invention.

Each of FIGS. 3, 4, and 5 also show a support collar or land 70 that surrounds each alignment post 58. The support collar is described below in connection with FIGS. 6 and 7.

Figure 6:
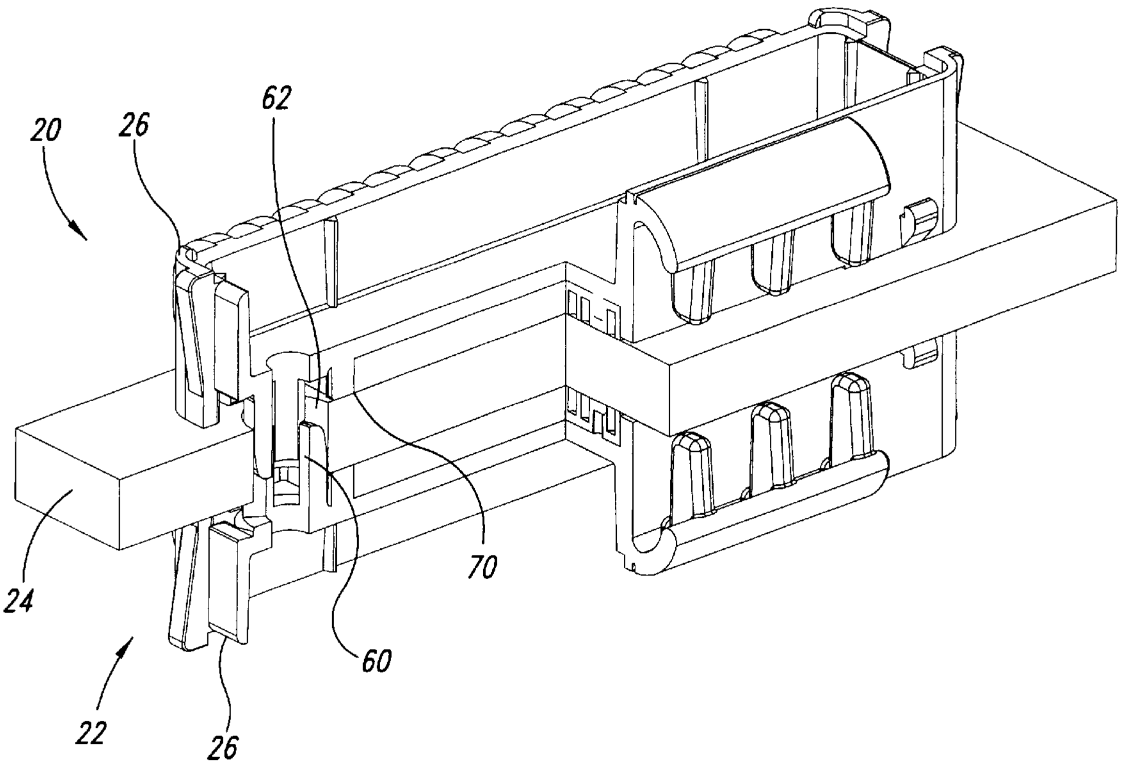
FIG. 6 is a partial cutaway, isometric view showing two casings being coupled to a relatively thick circuit board.

FIG. 6 shows a printed circuit board of relative thickness positioned between two casings 20 and 22. Thick circuit board 24 is sufficiently thick that the prongs 60 of a connector on one side of the circuit board 24 only partially enter the spaces 62 of the connector on the other side of the circuit board 24. Accordingly, the support collar 70 contacts the printed circuit board 24 and acts as a stop against which the connector assemblies 20 and 22 are secured by the threaded fasteners 50 (shown in FIG. 2) to hold connector assemblies 20 and 22 firmly in position relative to the circuit board 24.

Figure 7:
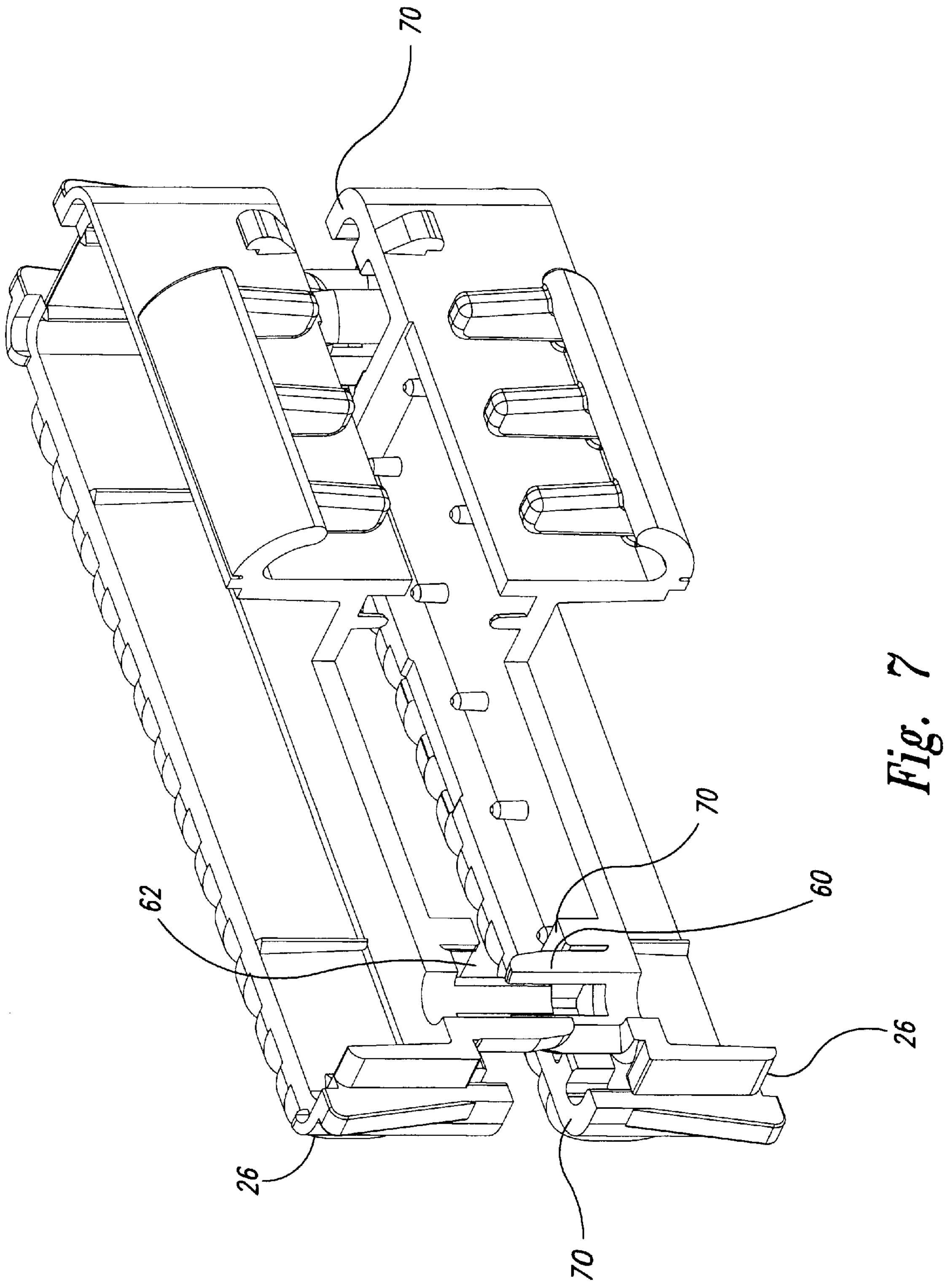
FIG. 7 is a partial cutaway, isometric view, showing two casings without a printed circuit board therein.

FIG. 7 illustrates more clearly the support collar or land 70 that surrounds the alignment posts 58. As the alignment prongs 60 projecting from one casing 26 advance into the spaces 62 between the alignment prongs 60 projecting from another mating casing 26, the surfaces 70 but against the surface of the printed circuit board 24 and stop, thus firmly clamping the casings 26 in predetermined correct relative positions and orientations.

FIG. 7 also illustrates the usefulness of the depth of the slots 62 and 68 in the alignment posts 58. As shown, the alignment prongs 60 and 66, and therefore the slots 62, 68 as well, are defined in terms of the support collars or lands 70. The alignment prongs 60, 66 project outwardly away from the casing 26 from a depth within the body of the casing 26. Preferably, the distance as measured outwardly from the land 70 toward the extreme end of the various prongs 60, 66 distal from the casing 26 is less than or equal to the distance as measured inwardly from the land 70 toward the extreme end of the prongs 60, 66 adjacent to the casing 26, i.e., the bottom of the slots 62, 68. In other words, the slots 62, 68 run deeper below the surface of the lands 70 than the prongs 60, 66 project above the same surface. Thus, the prongs 60, 66 always have sufficient depth within a corresponding slot to allow the lands 70 on the opposing casings 26 to contact one another when mated. The greater depth of the slots 62, 68 relative to the length of the prongs 60, 66, as measured from the land 70, insures that the casings 26 will always seat firmly against even the thinnest circuit board 24. Two connector assemblies 20 and 22 will also always seat one against the other in an application wherein a circuit board 24 is not inserted between the mating connector assemblies 20, 22.

Alternatively, the depth of the slots 62, 68 below the surface of the land 70 in relation to the projection of the prongs 60, 66 above the land 70 is optionally reduced a corresponding amount for use of the connector assemblies 20, 22 mounted oppositely from one another on either side of a circuit board 24 having a known minimum thickness.

Figure 8:
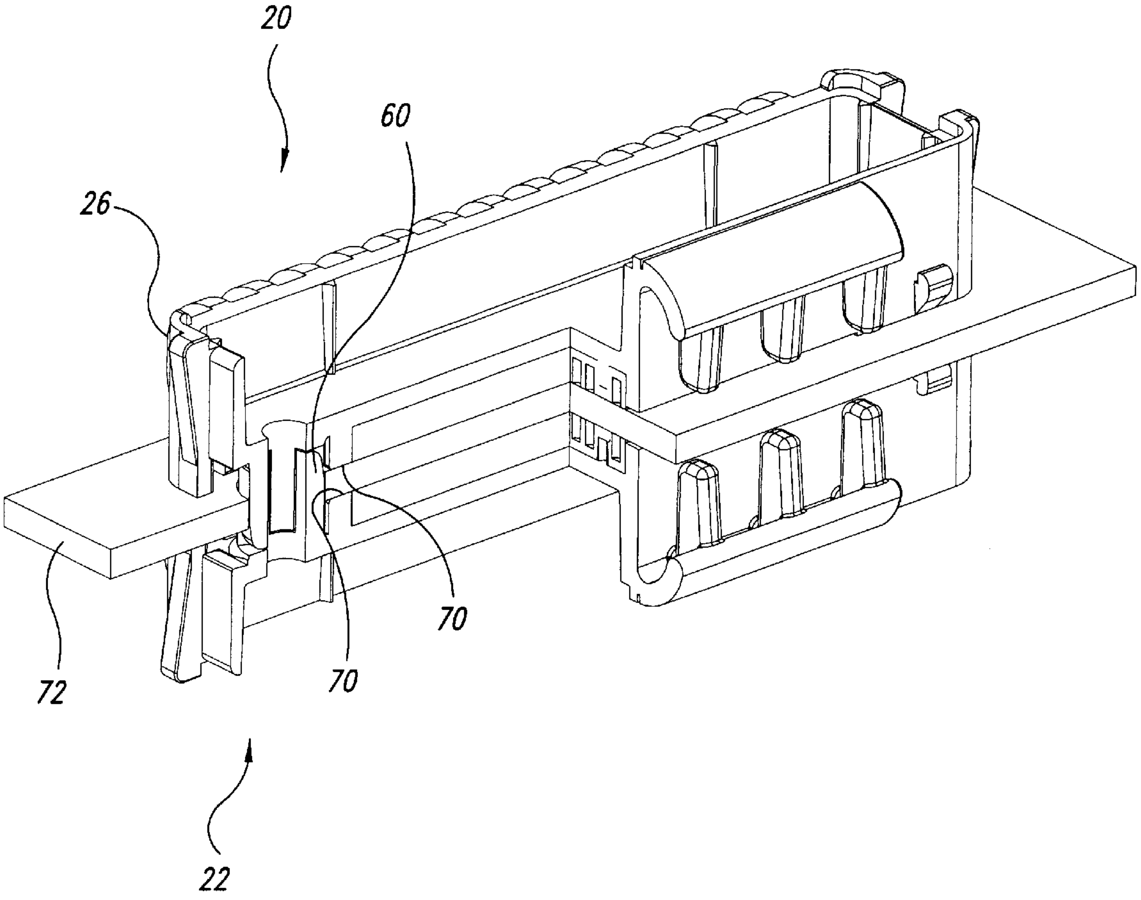
FIG. 8 is partial, cutaway isometric view of two casings being coupled to a relatively thin circuit board.
Figure 9:
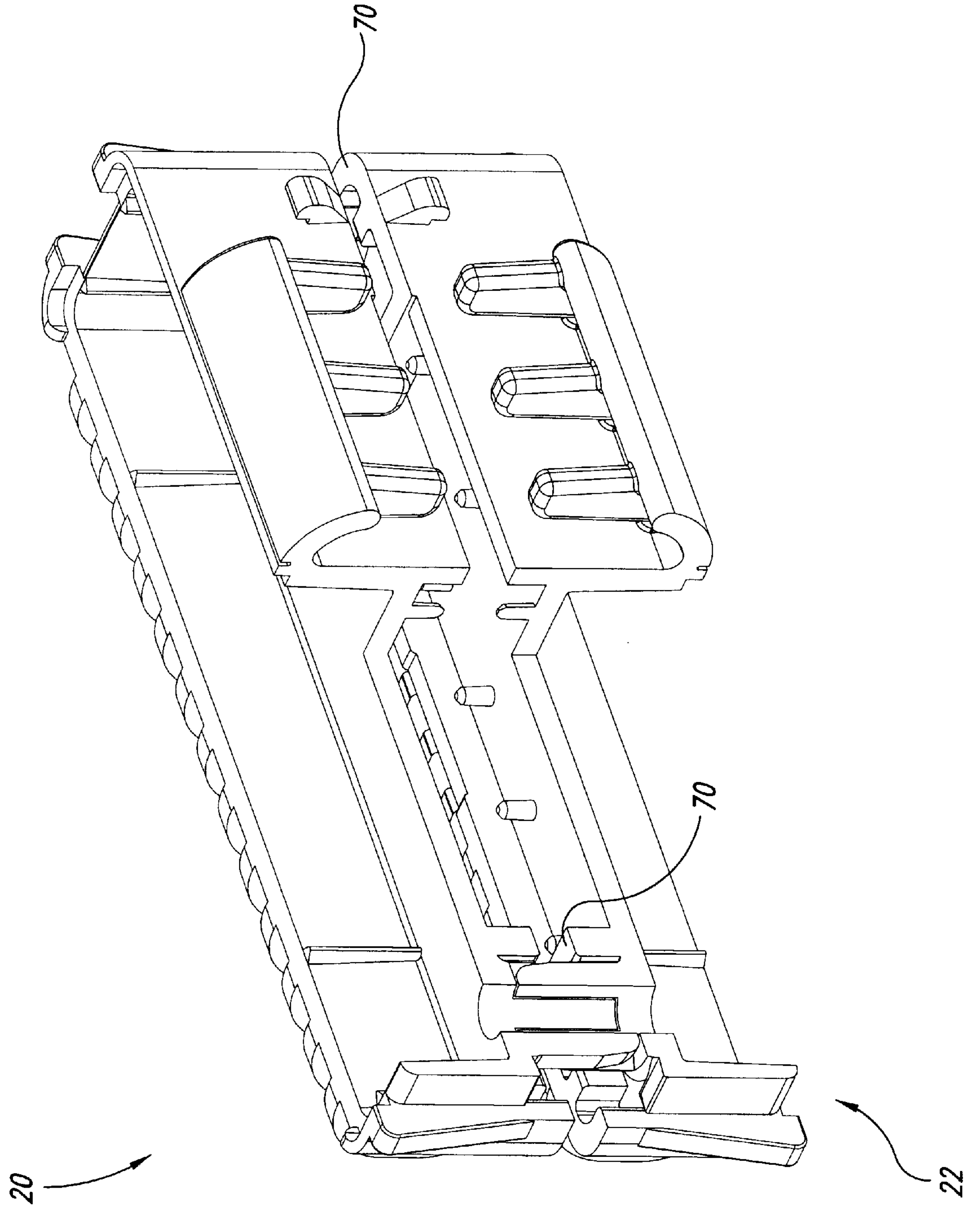
FIG. 9 is a partial, cutaway isometric view of the casing of FIG. 8 without the thin circuit board shown.

FIG. 8 illustrates the slots 62, 68 running deeper below the surface of the lands 70 than the prongs 60, 66 projecting above the same surface when used with a thin circuit board 72. With the thin circuit board 72, the prongs 60, 66 of one casing 26 advance deeply into the space 62, 68 of the opposing casing 26. FIG. 9 shows the connector assemblies 20 and 22 without the printed circuit board therebetween. FIG. 9 illustrates that the prongs 60, 66 have advanced almost completely into contact with the bottom of the slots 62, 68 when the printed circuit board 24 is mated with the respective land surfaces 70.

According to the principles of the present invention, an aperture or passage 72 is provide through the printed circuit board 24, as best shown in FIG. 2. The inside diameter of the aperture 72 closely matches the outside diameter of the alignment posts 58, as measured at the prongs 60, 66, so that the casing 26 is appropriately aligned on the circuit board. For example, the aperture 72 is formed relative to the outside diameter of the alignment posts 58 to provide a conventional slip fit, interference fit, or press fit with the alignment posts 58. Alternatively, a one alignment post 58 is provided with a closer class of fit, while another of the alignment posts 58 is provided with a more free class of fit. Such a configuration often provides ease of assembly, while insuring positional precision.

The use of the alignment posts 58 according to the invention permits the connector assemblies 20 and 22 to be properly and precisely aligned with the circuit board 24 and one another at each installation. The preferred triangular configuration of alignment prongs 60 particularly permits the repeatable proper and precise alignment of the connector assemblies 20, 22, regardless of the thickness of the circuit board. Thus, the casing 26 may be properly aligned with a thin circuit board 72, of the type shown in FIG. 8, or with a very thick circuit board 24, of the type shown in FIG. 6. The length of the prongs 60, 66 of the alignment post 58 are selected to match the expected variation between printed circuit boards 24, 72 intended for use with the invention. For wide variation in thicknesses, somewhat longer prongs 60, 66 are provided that accommodate the different thicknesses in circuit boards from one computer to another. If only modest differences in thickness are expected, then the prongs 60, 66 are shorter, so that there is sufficient depth in the slots 62, 68 between the prongs 60, 66 to allow the lands 70 on the casings 26 to seat firmly against the circuit board 24, 72 and adequately clamp to any circuit board within the expected thickness range.

What is claimed is:

1. An apparatus comprising:

a printed circuit board;

an aperture extending through the printed circuit board;

a casing having a first alignment assembly for extending into the aperture, the alignment assembly having a plurality of alignment members positioned for extending into the aperture, the alignment members having an outside surface that contacts the walls of the aperture to align the casing with respect to the printed circuit board, the alignment members having a space between them; and a mating member having a second alignment assembly for extending into the aperture from the opposite direction of the first alignment assembly, the second alignment assembly having a plurality of members that extend into the space between the alignment members of the first alignment assembly and having a space between them into which the alignment members of the first alignment assembly extend.

2. The apparatus according to claim 1 wherein the first alignment assembly includes three alignment members.

3. The apparatus according to claim 1 wherein the printed circuit board has a thickness approximately equal to the height of the first alignment members such that the alignment member extend substantially into the aperture when the casing abuts against the printed circuit board.

4. The apparatus according to claim 1 where in the printed circuit board has a thickness greater than the height of the first alignment members such that the alignment members extend only a short distance into the aperture of the printed circuit board when the casing abuts against the printed circuit board.

5. The apparatus according to claim 1 wherein the mating member is a second casing positioned on the opposite side of the printed circuit board.

6. The apparatus according to claim 5 wherein the alignment members of the first casing extend into the spaces between the alignment members of the second casing for the distance required for the casing to abut against the printed circuit board.

7. An interleaving connector assembly, comprising:

a circuit board having a set of through holes formed therein;

a first electrical connector formed with a plurality of alignment posts corresponding to different ones of the through holes, each alignment post formed of a plurality of regularly angularly-spaced apart alignment prongs projecting from a surface of the first connector;

a second electrical connector formed with a plurality of alignment posts formed of a plurality of regularly angularly-spaced apart alignment prongs substantially identical to the alignment prongs of the first electrical connector and projecting from a surface of the second connector; and wherein each alignment prong of the first connector fits in slots formed between the alignment prongs of the second connector, and each alignment prong of the second connector fits in slots formed between the alignment prongs of the first connector.

8. The connector assembly of claim 7, wherein:

the alignment prongs of the first and second connectors each further comprise an angular width that is substantially identical to the angular width of each of the other alignment prongs; and each of the alignment prongs are angularly-spaced apart a distance substantially equal to the angular width of the alignment prongs.

9. The method according to claim 8 wherein the mating assembly is comprised of an alignment assembly on a second casing.

10. The connector assembly of claim 8, wherein the first and second electrical connectors each further comprise a land formed on the surface from which the alignment prongs project, the land abutting the circuit board.

11. The connector assembly of claim 10, wherein the alignment prongs of the one of the first and second electrical connectors further comprise alignment prongs that both project outwardly from the land surface and extend inwardly from the land surface, such that the slots formed between the alignment prongs extend inwardly from the land surface.

12. The connector assembly of claim 11, wherein the alignment posts of both of the first and second electrical connectors further comprise alignment prongs oriented to present a substantially mirror image when the land surface of the first electrical connector is facing the land surface of the second electrical connector.

13. The connector assembly of claim 12, wherein the alignment posts of the both of the first and second electrical connectors further comprise:

a first alignment post having a first set of alignment prongs arranged with a first rotational orientation relative to the electrical connector, and a second alignment post having a second set of alignment prongs arranged with a second rotational orientation relative to the electrical connector angularly rotated relative to the rotational orientation of the first set of alignment prongs.

14. The connector assembly of claim 12, wherein the alignment posts of the both of the first and second electrical connectors further comprise alignment prongs oriented substantially identically with respect to the corresponding electrical connector.

15. The connector assembly of claim 14, wherein the alignment posts of the both of the first and second electrical connectors further comprise alignment prongs oriented in a triangular configuration.

16. An electrical connector assembly, comprising:

an electrical circuit board formed with a predetermined thickness and a set of two spaced-apart through holes having substantially identical inner diameters;

first and second mating electrical connectors, each electrical connector comprising:

a connector casing formed with a land surface on one side thereof, first and second sets of alignment prongs projecting from the land surface and extending into corresponding through holes in the circuit board, each set of alignment prongs defining an outer diameter substantially matched to the inner diameters of the through holes in the circuit board, and formed of a plurality of alignment prongs each having substantially identical angular widths and spaced apart an angular distance substantially identical to the angular widths; and wherein the first and second sets of alignment prongs of the first and second connectors interleave with one another within the corresponding through holes in the circuit board.

17. The electrical connector assembly of claim 16, wherein the first and second sets of alignment prongs are further rotationally oriented relative to the respective casings such that each of the first and second sets of alignment prongs present a mirror image of the corresponding set of alignment prongs within the corresponding through holes in the circuit board.

18. The electrical connector assembly of claim 17, wherein the first and second sets of alignment prongs projecting from the land surface further extend below the land surface toward a respective connector casing.

19. The electrical connector assembly of claim 17, wherein the first and second sets of alignment prongs are substantially identically rotationally oriented with a respective connector casing.

20. The electrical connector assembly of claim 19, wherein the first and second sets of alignment prongs each further comprise three alignment prongs arranged in a triangular configuration.

21. A method of aligning a casing with a printed circuit board comprising:

inserting a first set of alignment members extending from a casing into an aperture of a printed circuit board, the alignment members being inserted until the casing abuts against the printed circuit board;

inserting a mating assembly having a second set of alignment members into the aperture from the other side of the printed circuit board to fit into spaces between the first set of alignment members; and rigidly connecting the casing having the first set of alignment members to the mating assembly.

22. The method according to claim 20 wherein the method of rigidly connecting includes:

inserting a fastener through an aperture in the alignment assembly; and connecting the fastener to the mating assembly.

23. An apparatus comprising:

a printed circuit board;

an aperture extending through the printed circuit board;

a casing having a first alignment assembly that extends into the aperture, the alignment assembly having an alignment member positioned in the aperture, the alignment member having an outside surface that contacts the walls of the aperture to align the casing with respect to the printed circuit board; and a mating member having a second alignment assembly that extends into the aperture from the opposite direction of the first alignment assembly, the second alignment assembly having a member that extends into the space between the alignment member of the first alignment assembly and the walls of the aperture.

24. An apparatus comprising:

a casing having a first alignment assembly for extending into an aperture of a printed circuit board, the alignment assembly having a plurality of alignment members for positioning in the aperture, the alignment members having an outside surface for contacting the walls of the aperture to align the casing with respect to the printed circuit board, the alignment members having a space between them; and a mating member having a second alignment assembly for extending into the aperture of the printed circuit board from the opposite direction of the first alignment assembly, the second alignment assembly having a plurality of members for extending into the space between the alignment members of the first alignment assembly and having a space between them into which the alignment members of the first alignment assembly may extend.

* * * * *